(12) United States Patent
Deeney

(10) Patent No.: US 6,813,162 B2
(45) Date of Patent: Nov. 2, 2004

(54) METHOD AND APPARATUS FOR SUPPORTING CIRCUIT COMPONENT HAVING SOLDER COLUMN ARRAY INTERCONNECTS USING INTERPOSED SUPPORT SHIMS

(75) Inventor: Jeffrey L. Deeney, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 307 days.

(21) Appl. No.: 09/992,864

(22) Filed: Nov. 16, 2001

(65) Prior Publication Data

US 2003/0095392 A1 May 22, 2003

(51) Int. Cl.[7] ................................................ H05K 1/18
(52) U.S. Cl. ...................... 361/762; 361/803; 361/720; 361/730; 361/758
(58) Field of Search ................................ 361/762, 760, 361/758, 803, 720, 748, 730, 770, 804, 742; 211/41.17; 439/76.1

(56) References Cited

U.S. PATENT DOCUMENTS

| | | | |
|---|---|---|---|
| 3,561,107 A | * | 2/1971 | Best et al. ............... 228/110.1 |
| 4,164,003 A | | 8/1979 | Cutchaw |
| 4,545,610 A | | 10/1985 | Lakritz et al. |
| 4,581,680 A | | 4/1986 | Garner |
| 4,886,571 A | | 12/1989 | Suzuki et al. |
| 5,222,014 A | | 6/1993 | Lin |
| 5,239,198 A | | 8/1993 | Lin et al. |
| 5,244,143 A | | 9/1993 | Ference |
| 5,541,450 A | | 7/1996 | Jones et al. |
| 5,557,503 A | | 9/1996 | Isaacs |
| 5,615,735 A | | 4/1997 | Yoshida |
| 5,805,427 A | | 9/1998 | Hoffman |
| 5,905,636 A | | 5/1999 | Baska et al. |
| 5,926,370 A | | 7/1999 | Cromwell |
| 5,956,576 A | | 9/1999 | Toy et al. |
| 5,978,229 A | | 11/1999 | Kim |
| 5,990,418 A | | 11/1999 | Bivona et al. |
| 6,061,235 A | | 5/2000 | Cromwell |
| 6,084,178 A | | 7/2000 | Cromwell |
| 6,198,630 B1 | | 3/2001 | Cromwell |
| 6,231,333 B1 | | 5/2001 | Gruber |
| 6,235,996 B1 | | 5/2001 | Farooq |
| 6,276,596 B1 | | 8/2001 | Gruber |
| 6,410,981 B2 | * | 6/2002 | Tao .......................... 257/704 |

OTHER PUBLICATIONS

Jeffrey L. Deeney et al, patent application filed on Nov. 16, 2001 titled Method And Apparatus Of Supporting Circuit Component Having A Solder Column Array Using Interspersed Rigid Columns, pp. 1–9 and 1 sheet of a drawing.
Jeffrey L. Deeney et al., patent application filed on Nov. 16, 2001 titled Method And Appratus For Supporting A Circuit Component Having A Solder Column Interconnects Using An External Support, pp. 1–15 and 2 sheets of drawings.

(List continued on next page.)

*Primary Examiner*—David Martin
*Assistant Examiner*—Hung S. Bui

(57) ABSTRACT

A circuit board assembly has a circuit board and a column grid array ("CGA") integrated circuit package. The CGA integrated circuit package has a substrate having an array of solder columns extending from a bottom surface. An oversized lid is affixed to the substrate. Support shims are disposed between a portion of the lid that extends beyond an outer periphery of the substrate and a circuit board to which the CGA integrated circuit package is mounted. The support shims are affixed to the lid with adhesive after the CGA integrated circuit package is mounted on the circuit board. The adhesive accommodates any variations in height in the CGA integrated circuit package.

11 Claims, 1 Drawing Sheet

OTHER PUBLICATIONS

Thomas P. Dolbear et al., Effect of Mechanical Shock and Vibration on the Second–level Temperature Cycling Reliability of Ceramic Ball Grid Arrays with a Continuous Compressive Load Applied. 5 unnumbered pages.

R. Bargerhuff et al., Development of a Large Heatsink Support Structure, 12 unnumbered pages.

Thomas J. Augustin et al., patent application filed on Nov. 16, 2001 titled Method And Apparatus For Shock And Vibration Isolation Of A Circuit Component, pp. 1–15 and 2 sheets of drawings.

* cited by examiner

METHOD AND APPARATUS FOR SUPPORTING CIRCUIT COMPONENT HAVING SOLDER COLUMN ARRAY INTERCONNECTS USING INTERPOSED SUPPORT SHIMS

FIELD OF THE INVENTION

This invention relates to circuit components mounted on circuit boards by solder column interconnects or arrays, and more particularly, to support of circuit components having column grid arrays.

BACKGROUND OF THE INVENTION

Solder column interconnects or arrays are used to interconnect circuit packages to circuit boards, most typically large ceramic integrated circuit packages. One such package is the column grid array (CGA) integrated circuit package that has a ceramic substrate with an array of solder columns that extend out from it, typically from the bottom surface. The solder columns are attached at one end to connection pads or locations on the ceramic substrate. The solder columns are sufficiently tall so that when the circuit package is placed on a circuit board, the solder columns can accommodate the difference in thermal expansion between the ceramic integrated circuit package and the printed circuit board. The solder columns are soldered to respective pads on the circuit board using known techniques, such as a convection reflow solder process.

One problem with solder column arrays is that the solder columns do not withstand compressive force well. The solder columns in the solder column arrays are typically made of a 90%/10% Pb/Sn solder, making them soft. Moreover, the individual solder columns are very thin. Consequently, if any significant amount of compressive force is applied to the circuit package, such as might be applied by a cooling solution such as a heat sink or fan, the resulting weight on the circuit package may cause the solder column array to compress, particularly over time, which may compromise reliability. In this regard, loads in excess of about 10 to 20 grams per column exert sufficient compressive force so that reliability may be compromised. Since CGA integrated circuit packages are being increasingly used for high power integrated circuits, the cooling solution required often has considerable mass. It is not unusual for the heat sink or cooling solution used with such high power integrated circuits to exceed one pound.

SUMMARY OF THE INVENTION

In accordance with an aspect of the invention, a circuit board assembly has a circuit board and an integrated circuit package. The integrated circuit package has a substrate having an array of solder columns extending from a bottom surface. The integrated circuit package has a lid that is affixed to top of the substrate. The lid is oversized with respect to the substrate so that it has a portion that extends beyond the outer periphery of the substrate. In an aspect of the invention, the periphery of the lid is larger than the outer periphery of the substrate so that the portion of the lid extending beyond the outer periphery of the substrate extends around the outer periphery of the substrate. Supports shims re disposed between the portion of the lid extending beyond the outer periphery of the substrate and portions of a circuit board when the CGA integrated circuit package is mounted on the circuit board. The support shims support the column grid array integrated circuit package against compressive force, such as would be exerted by a cooling solution mounted on the CGA integrated circuit package, and are made of sufficiently rigid material to do so, such as metal or plastic.

In an aspect of the invention, the support shims are disposed between the portion of the lid extending beyond the periphery of the substrate and the portions of the circuit board after the integrated circuit package is mounted on the circuit board and affixed to the lid by adhesive. The adhesive accommodates any variation in height of the integrated circuit package.

In an aspect of the invention, the integrated circuit package is rectangular and the shims are corner shims having first and second leg sections at generally right angles to each other with a support shim disposed at each corner of the integrated circuit package.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings wherein.

DETAILED DESCRIPTION

The following detailed description is merely exemplary in nature and is in no way intended to limit the invention, its application, or uses.

Figure 1:
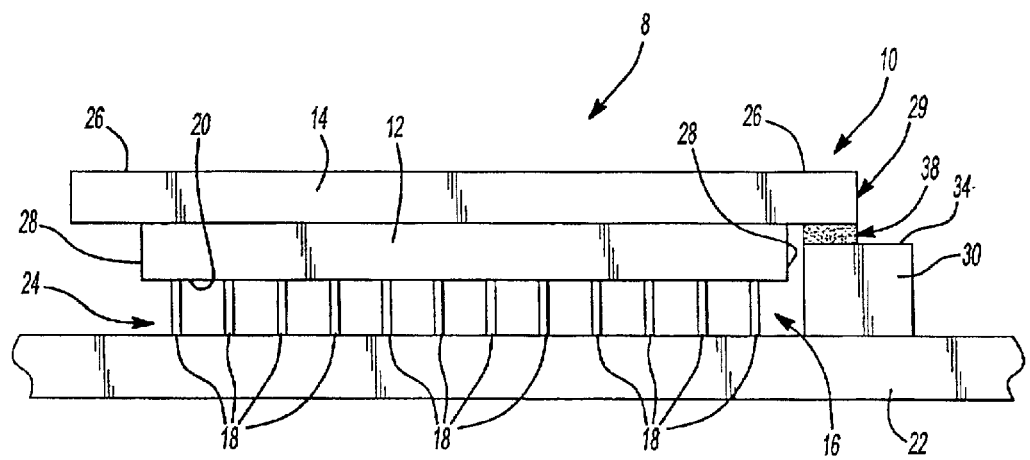
FIG. 1 a side view of a column grid array integrated circuit package mounted on a circuit board and having support shims in accordance with the invention.

Referring to FIG. 1, a circuit board assembly 8 has a circuit board 22 and a CGA integrated circuit package 10. It should be understood that while the invention is described as implemented in CGA integrated circuit package, it is not limited to CGA integrated circuit packages and can be utilized on any circuit package having solder column interconnects or arrays. CGA integrated circuit package 10 can be a CPU package but can also be other types of circuit packages, such as ASICs (application specific integrated circuits).

CGA integrated circuit package 10 has a substrate 12, usually made of ceramic, and a package lid 14. A solder column array 16 having an array of solder columns 18 extends from a bottom side 20 of substrate 12. When CGA integrated circuit package 10 is mounted on circuit board 22, solder columns 18 of solder column array 16 are soldered to respective connection pads 24 on circuit board 22, which is illustratively a printed circuit board.

A portion 26 of lid 14 extends beyond an outer periphery or edge 28 of substrate 12. In an aspect of the invention, lid 14 is oversized with respect to substrate 12 so that outer periphery 29 of lid 14 is larger than the outer periphery 28 of substrate 12 with portion 26 of lid thus extending beyond the outer periphery 28 of substrate 12 extending around the outer periphery 28 of substrate 12. One or more support shims 30 are disposed between portion 26 of lid 14 and circuit board 22 when CGA integrated circuit package 10 is mounted to circuit board 22. In an aspect of the invention, CGA integrated circuit package 10 is rectangular and a support shim 30 is provided at each corner of CGA integrated circuit package 10.

Figure 2:
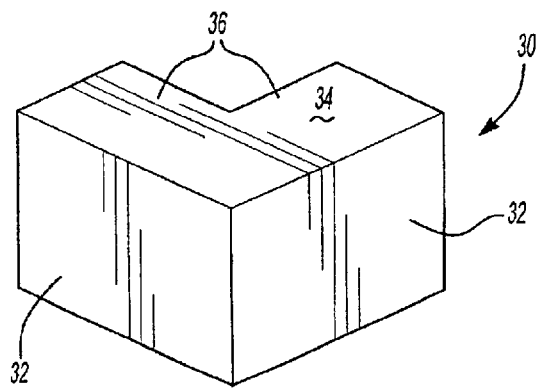
FIG. 2 is a perspective view of a corner support shim in accordance with an embodiment of the invention.

Turning to FIG. 2, an embodiment of support shim 30 is shown in more detail. Support shim 30 is formed as a corner section having first and second leg sections 32 generally at right angles to each other and an inwardly extending top flange 34 having first and second sections 36 generally at right angles to each other. Support shims 30 are illustratively affixed to CGA integrated circuit package 10. In an aspect of the invention, adhesive 38 (FIG. 1) is disposed between top flanges 34 of support shims 30 and portion 26 of lid 14 and fills the gaps between top flanges 34 and portion 26 of lid 14. The adhesive used is suitable for bonding the material of which support shims 30 are made and of which lid 14 is made. Shims 30 can be made of any material that is sufficiently rigid to support CGA integrated circuit package 10 against compressive force, such as exerted by a cooling solution mounted on CGA integrated circuit package 10, metal or plastic for example. For example, shims 30 could be made of stainless steel, lid 14 of aluminum-silicon carbide (AlSiC), and adhesive 38 could illustratively be an ultraviolet curable adhesive, such as Loctite 3526 available from Loctite Corporation, Rocky Hills, Conn., a two part epoxy that cures at room temperature, such as 3M DP460 available from Minnesota Mining and Manufacturing, St. Paul, Minn., or a single part thermoset epoxy such as Ablestik Laboratories 84.3, available from Ablestik Laboratories, Rancho Dominguez, Calif. While each support shim 30 would typically contact the surface of circuit board 22, it should be understood that support structures could be provided on circuit board 22 for support shims 30 to contact. Support shims 30 are preferably secured to CGA integrated circuit package 10 after CGA integrated circuit package 10 has been soldered to circuit board 22.

Figure 3:
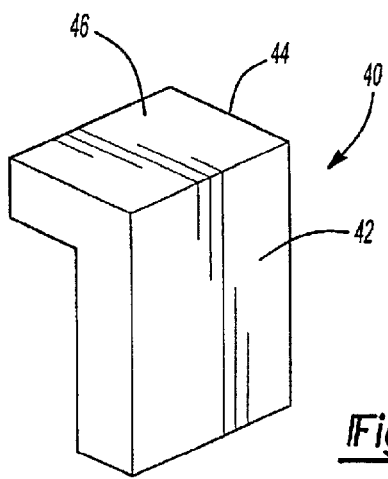
FIG. 3 is a perspective view of a support shim in accordance with an alternative embodiment of the invention.

FIG. 3 shows a variation of the invention shown in FIG. 2 where one or more shims 40 are used in lieu of or in addition to one or more shims 30. Each shim 40 comprises an L-shaped section having a leg 42 and a top flange 44 and is secured to CGA integrated circuit package 10 in the same fashion as shims 30. For example, each shim 40 is secured to CGA integrated circuit package 10 by adhesive 38 disposed between a top surface 46 of top flange 44 of shim 40 and lid 14 of CGA integrated circuit package 10. Shims 40, however, can be secured anywhere around CGA integrated circuit package 10 and need not be secured to CGA integrated circuit package 10 at the corners of CGA integrated circuit package 10.

It should be understood that while shims 30 and 40 are shown with top flanges 34, 44, respectively, shims 30 and 40 could be formed without their respective top flanges 34, 44.

It should be understood that the coefficient of thermal expansion (CTE) of the support shims 30 or 40 is important. In each instance, the CTE of the frame support shims 30 or 40, whichever are used, should preferably match the CTE of the supported CGA integrated circuit package 10 as closely as possible. The CTE of solder columns 18 is about 27 and that of ceramic is about 8 ppm/degree C. Stainless steel is thought to have a suitable CTE.

Because of manufacturing tolerances, the height of CGA integrated circuit package 10 can vary by +/−4 mils. The adhesive attachment accommodates the tolerance variations assuring a tight support of CGA integrated circuit package 10 to circuit board 22. In this regard, support shims 30 or 40, whichever are used, are secured to CGA integrated circuit package 10 after CGA integrated circuit package 10 has been soldered to circuit board 22, such as by the above mentioned reflow soldering process.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A circuit board assembly, comprising:
   a. a circuit board;
   b. an integrated circuit package having a substrate with an array of solder columns extending from a bottom surface of the substrate to the circuit board when the integrated circuit package is mounted on the circuit board;
   c. a lid affixed to the substrate, the lid having a portion that extends beyond an outer periphery of the substrate; and
   d. at least one support shim disposed between the portion of the lid that extends beyond the outer periphery of the substrate and a portion of the circuit board to which the integrated circuit package is mounted to support the column grid array integrated circuit package against compressive force.

2. The apparatus of claim 1 wherein the lid is oversized with respect to the substrate so that an outer periphery of the lid is larger than the outer periphery of the substrate so that the portion of the lid that extends beyond the outer periphery of the substrate extends around the outer periphery of the substrate.

3. The apparatus of claim 2 wherein each support shim is disposed between the portion of the lid that extends beyond the periphery of the substrate and the portion of the circuit board after the integrated circuit package is mounted on the circuit board and secured to at least one of the lid and the substrate by adhesive, the adhesive accommodating variations in the height of the integrated circuit package.

4. The apparatus of claim 2 wherein the integrated circuit package is rectangular and the said at least one support shim includes a support shim disposed at each corner of the integrated circuit package.

5. The apparatus of claim 4 wherein each support shim is a corner shim having first and second leg sections at generally right angles to each other.

6. The apparatus of claim 5 wherein each support shim has an inwardly extending top flange having first and second sections at generally right angles to each other.

7. The apparatus of claim 6 wherein adhesive is disposed between the top flange of each support shim and the portion of the lid extending beyond the outer periphery of the substrate to affix the support shim to the integrated circuit package and to fill gaps between the top flanges of the support shims and the portion of the lid extending beyond the outer periphery of the substrate.

8. A circuit board assembly, comprising:
   a. a circuit board;
   b. a rectangular column grid array integrated circuit package having a substrate with an array of solder columns extending from a bottom surface;
   c. a lid affixed to the substrate, the lid having a portion that extends beyond an outer periphery of the substrate; and
   d. a support shim disposed at each corner of the column grid array integrated circuit package between the portion of the lid that extends beyond the outer periphery of the substrate and a portion of a circuit board to which the column grid array integrated circuit package is mounted to support the column grid array integrated circuit package against compressive force, each support shim disposed between the lid and the circuit board after the column grid array integrated circuit package has been mounted to the circuit board and secured to at least one of the substrate and lid by adhesive, the adhesive accommodating variations in height in the column grid array integrated circuit package.

9. The apparatus of claim 8 wherein the lid is oversized with respect to the substrate so that an outer periphery of the lid is larger than the outer periphery of the substrate so that the portion of the lid that extends beyond the outer periphery of the substrate extends around the outer periphery of the substrate.

10. The apparatus of claim 9 wherein each support shim is a corner shim having first and second leg sections at generally right angles to each other and an inwardly extending top flange having first and second sections at generally right angles to each other, each support shim affixed to the column grid array integrated circuit package by adhesive disposed between the portion of the lid extending beyond the periphery of the substrate and that support shim's top flange, the adhesive filling a gap between the portion of the lid extending beyond the periphery of the substrate and the top flange of that support shim.

11. The apparatus of claim 1 wherein the integrated circuit package comprises a column grid array integrated circuit package.

\* \* \* \* \*